(12) United States Patent
Lam

(10) Patent No.: US 8,790,751 B2
(45) Date of Patent: Jul. 29, 2014

(54) METHOD OF IMPROVING ADHESION OF DIELECTRIC CAP TO COPPER

(75) Inventor: King-Sang Lam, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 1454 days.

(21) Appl. No.: 12/082,988

(22) Filed: Apr. 16, 2008

(65) Prior Publication Data
US 2009/0260759 A1 Oct. 22, 2009

(51) Int. Cl.
*B05D 3/00* (2006.01)
*H01L 21/768* (2006.01)

(52) U.S. Cl.
CPC .... *H01L 21/76826* (2013.01); *H01L 21/76828* (2013.01); *H01L 21/76832* (2013.01)
USPC .......................................... 427/294; 427/532

(58) Field of Classification Search
CPC . H01L 21/324; H01L 21/318; H01L 21/3105; H01L 21/477; H01L 2224/84895; H01L 21/76834; H01L 21/76883; H01L 21/76838; H01L 23/53238; H05B 3/00; H05B 3/06; C23C 10/00; C23C 10/08
USPC .......... 427/294, 532; 438/653, 655, 754, 791, 438/792
See application file for complete search history.

(56) References Cited

U.S. PATENT DOCUMENTS

| | | | |
|---|---|---|---|
| 5,447,887 A * | 9/1995 | Filipiak et al. | 438/644 |
| 2003/0203614 A1 * | 10/2003 | Rajagopalan et al. | 438/622 |
| 2004/0152333 A1 * | 8/2004 | Zhao et al. | 438/754 |
| 2005/0032392 A1 * | 2/2005 | Goh et al. | 438/763 |

* cited by examiner

*Primary Examiner* — Michael Wieczorek

(57) ABSTRACT

In a method of promoting adhesion between a copper body and a dielectric layer in contact therewith, the copper body and dielectric layer are placed in a vacuum chamber, in a chamber, the copper body and dielectric layer within the chamber are heated, and $SiH_4$ is provided in the chamber.

15 Claims, 3 Drawing Sheets

METHOD OF IMPROVING ADHESION OF DIELECTRIC CAP TO COPPER

BACKGROUND OF THE INVENTION

1. Field of the Invention

This invention relates generally to electronic devices, and more particularly, to improvement of adhesion of layers therein.

2. Discussion of the Related Art

FIG. 1 illustrates a damascene structure 10 as part of a wafer 12, enlarged for clarity. The structure 10 includes a copper line 14, a silicon nitride layer 16 thereon, and a dielectric layer 18 on the silicon nitride layer 16. The silicon nitride layer 16 and dielectric layer 10 include an opening in which is provided a tantalum liner 20 in contact with the copper line 14. Within the tantalum liner 20 and in contact therewith is another copper line 22, which is in electrical communication with the copper line 14 through the tantalum liner 20.

The resulting structure is then to be capped by depositing a silicon nitride cap layer 24. (FIG. 2) However, it has been found that the interface condition between the copper 22 and silicon nitride cap 24 is such that adhesion between these two parts is poor. In addition, it has been found that silicon from the silicon nitride layer 24 diffuses into the copper line 24, degrading performance thereof.

In an attempt to improve the situation, and again with reference to FIG. 1, a plasma etch is undertaken on the exposed surface of the structure 10 in order to remove native CuO from the surface of the copper 22, with the silicon nitride layer 24 then being deposited thereon. While such a process has been found to improve adhesion between the copper 22 and the silicon nitride 24, further improvement is desired so that a strong bond between the silicon nitride cap 24 and the copper 22 can be achieved.

SUMMARY OF THE INVENTION

Broadly stated, the present method of promoting adhesion between a copper body and a dielectric layer in contact therewith comprises placing the copper body and dielectric layer in a chamber, and providing $SiH_4$ in the chamber.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention which illustrates the best mode presently contemplated by the inventors for practicing the invention.

Figure 1:
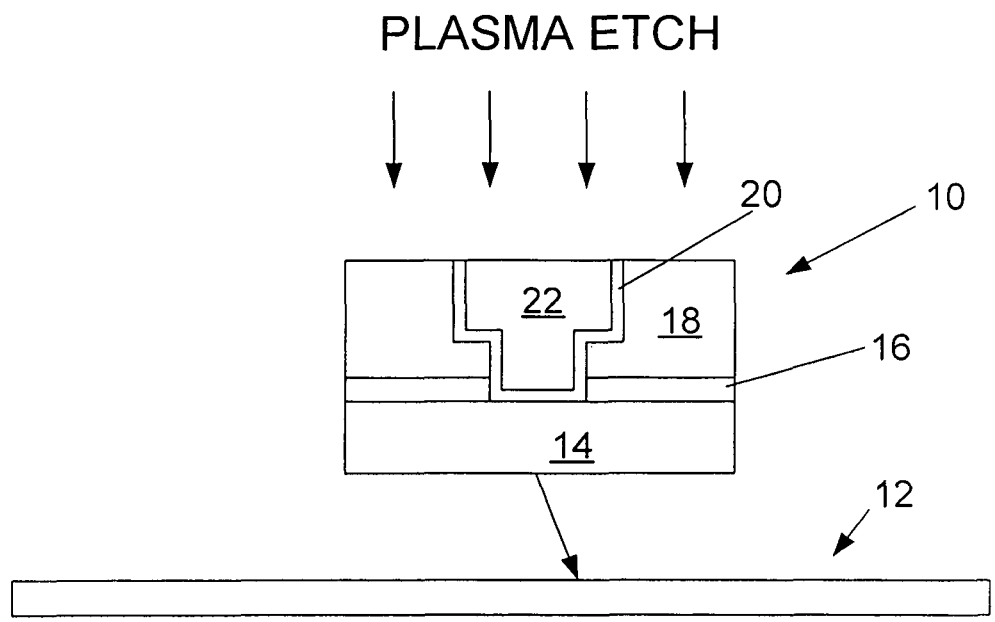
FIGS. 1 and 2 illustrate a prior art approach to applying a silicon nitride cap to a copper body.
Figure 2:
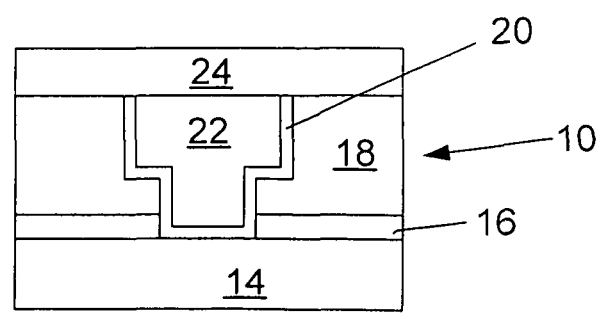
Figure 3:
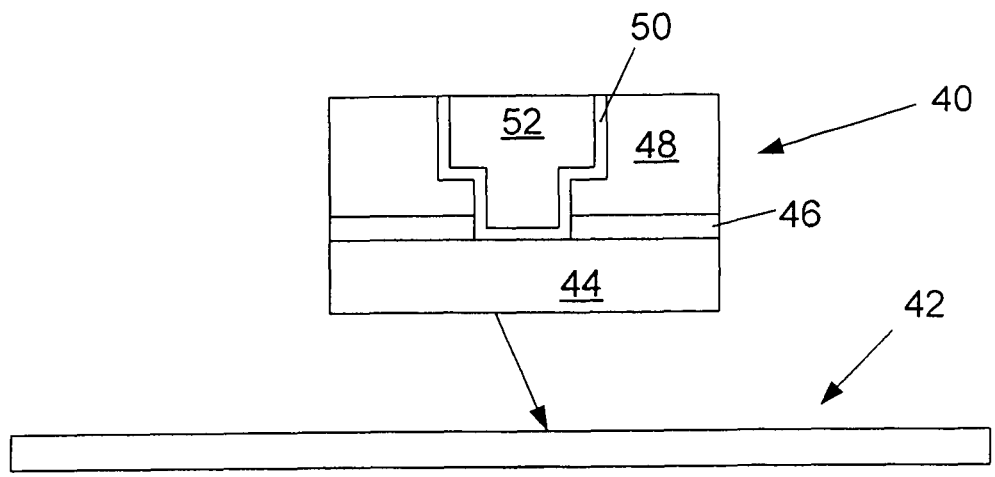
FIGS. 3, 4 and 5 illustrate the present approach to applying a silicon nitride cap to a copper body.

Similar to FIG. 1, FIG. 3 illustrates a damascene structure 40 as part of a wafer 42, enlarged for clarity. The structure includes a copper line 44, a silicon nitride (SiOn) layer 46 thereon. A dielectric layer 48 on the silicon nitride layer. The silicon nitride layer 46 and dielectric layer 48 include an opening in which is provided a tantalum liner 50 in contact with the copper line 44. Within the tantalum liner 50 and in contact therewith is another copper line 52, which is in electrical communication with the copper line 44 through the tantalum liner 50.

Figure 4:
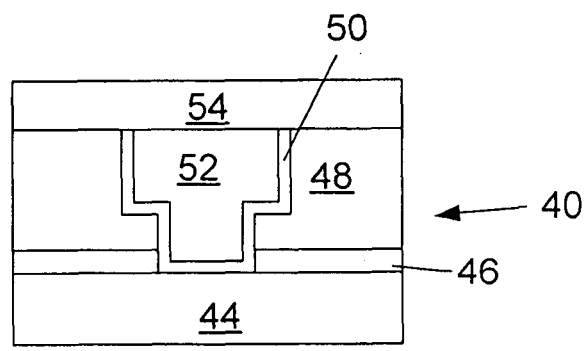
Figure 5:
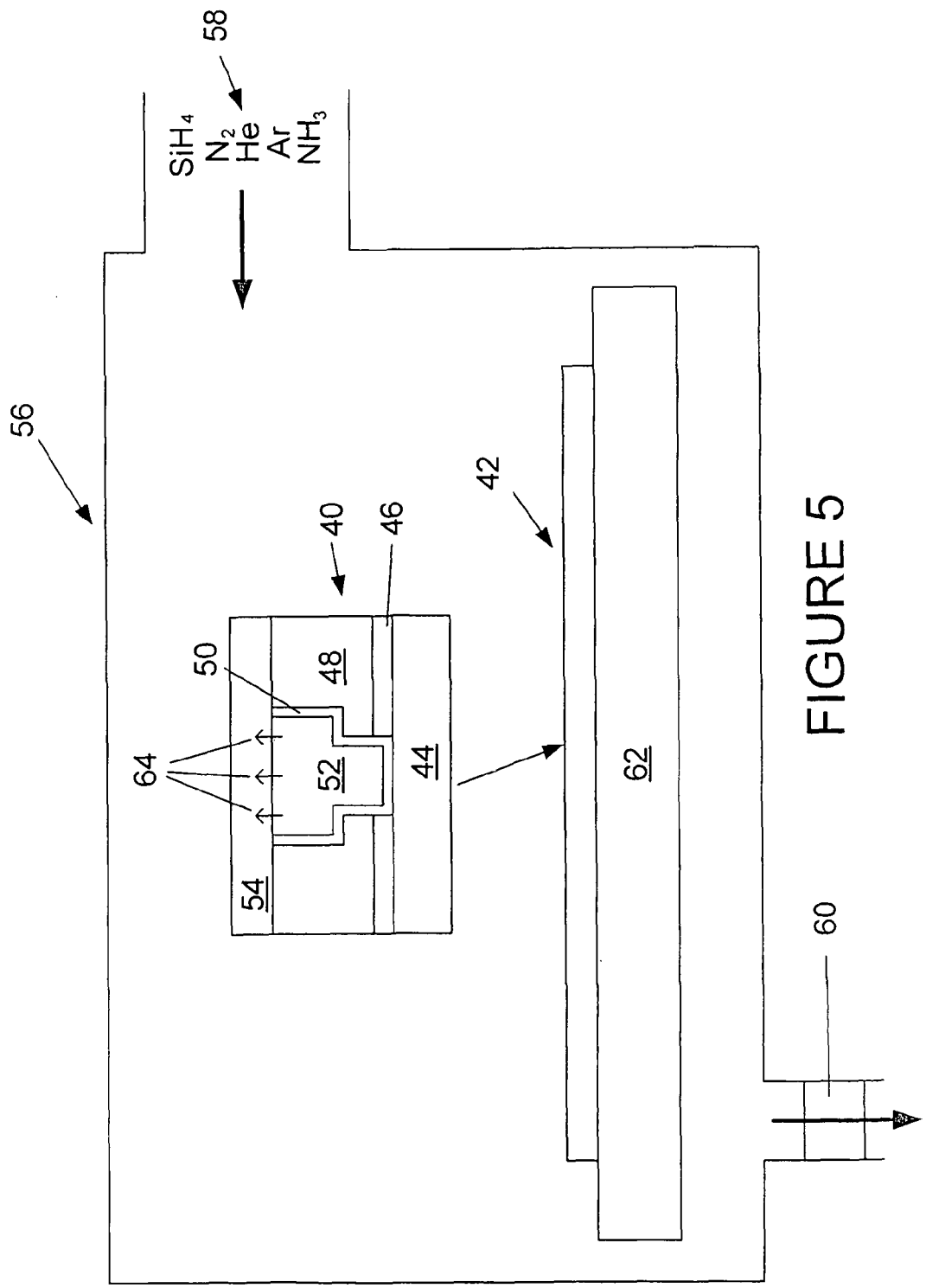

However, in the present embodiment (FIG. 4), a silicon nitride layer 54 is deposited directly on the resulting structure, in contact with the copper line 52. Then, the wafer 42 is placed in a vacuum chamber 56 (FIG. 5) and exposed to $SiH_4$, along with $N_2$, He, Ar, and $NH_3$ (58). The flow rate of $SiH_4$ is 1-3000 sccm, while the flow rate of the other gases is from 1-30000 sccm. This mixture of gases is provided at a pressure of 0.1 mTorr to 1 Atm, maintained by pump 60 of the chamber 56. A heater 62 in the chamber 56, on which the wafer 42 is placed, maintains a wafer temperature of from 200° to 600° C. for a time period of from 0.1 seconds to 100 seconds.

It has been found that this process greatly promotes and improves adhesion between the copper line 52 and the silicon nitride 64 thereon and in contact therewith. This is because the process causes copper atoms 64 to diffuse into the silicon nitride cap 54 to create a strong interface between the copper 52 and the silicon nitride layer 54 and eliminate silicon diffusion into the copper line 52. The converted interface also reduces boundary diffusion which is believed to be a major factor in electro migration. The copper 64 entering the silicon nitride layer 54, it is expected, forms $Cu_xSi_y$ in the silicon nitride layer 54, greatly improving the adhesion between the copper 52 and silicon nitride layer 54, providing a strong and stable resulting structure as desired.

It will be readily understood that the process is applicable to both single damascene and duel-damascene structures. Furthermore, the layer 46 may be any form of dielectric cap, such as SiON, SiCN, or $SiO_2$.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of promoting adhesion in a wafer comprising:
placing a wafer in a chamber, the wafer comprising:
a first copper line;
  a first silicon nitride layer disposed over the first copper line;
  a dielectric layer disposed over the silicon nitride layer;
  a tantalum liner disposed in an opening in the dielectric layer and the silicon nitride layer;
  a second copper line disposed in a volume bounded by the tantalum liner; and
  a second silicon nitride layer disposed over the second copper line and the dielectric layer; and
providing $SiH_4$ in the chamber,
wherein, copper atoms from the second copper line are diffused into the second silicon nitride layer to increase an interface between the second copper line and the second silicon nitride layer,
further wherein, the diffused copper atoms from the second copper line eliminate silicon diffusion from the second silicon nitride layer into the second copper line.

2. The method of claim 1 wherein a vacuum is applied within the chamber.

3. The method of claim 2 wherein the vacuum applied is 0.1 m Torr to 760 Torr.

4. The method of claim 1 wherein the wafer is heated in the chamber.

5. The method of claim 4 wherein the the wafer is heated to a temperature within the range of from 200° -600° Celsius.

6. The method of claim 5 wherein the wafer is heated to a temperature within the range of from 200° -600° Celsius for a period within the range of from 0.1 seconds to 100 seconds.

7. The method of claim 1 wherein inserted at least a portion of the wafer is structured as a single damascene structure.

8. The method of claim 1 wherein at least a portion of the wafer is structured as a duo-damascene structure.

9. A method of promoting adhesion in a wafer comprising:
placing a wafer in a chamber, the wafer comprising:
a first copper line;
  a first silicon nitride layer disposed over the first copper line;
  a dielectric layer disposed over the silicon nitride layer;
  a tantalum liner disposed in an opening in the dielectric layer and the silicon nitride layer;
  a second copper line disposed in a volume bounded by the tantalum liner; and
  a second silicon nitride layer disposed over the second copper line and the dielectric layer; and
applying a vacuum within the chamber;
heating the wafer within the chamber; and
providing $SiH_4$ in the chamber,
wherein, copper atoms from the second copper line are diffused into the second silicon nitride layer to increase an interface between the second copper line and the second silicon nitride layer and to eliminate silicon diffusion from the second silicon nitride layer into the second copper line.

10. The method of claim 9 wherein the vacuum applied is 0.1 mTorr below atmospheric pressure, and the wafer is heated to a temperature within the range of from 200° -600° Celsius for a period within the range of from 0.1 seconds to 100 seconds.

11. A method of promoting adhesion in a wafer comprising:
in a wafer comprising: a first copper line, a first silicon nitride layer disposed over the first copper line, a dielectric layer disposed over the first silicon nitride layer, a tantalum liner disposed in an opening in the dielectric layer and the first silicon nitride layer, a second copper line disposed in a volume bounded by the tantalum liner, and a second silicon nitride layer disposed over the second copper line and the second silicon nitride layer, diffusing copper atoms from the second copper line into the dielectric layer to increase an interface between the second copper line and the second silicon nitride layer; and
placing the wafer in a chamber over a heat source,
further wherein, diffusing copper atoms from the second copper line eliminates silicon diffusion from the second silicon nitride layer into the second copper line.

12. The method of claim 11 wherein the dielectric layer is a nitride layer.

13. The method of claim 12 wherein the method comprises providing $SiH_4$ in the chamber.

14. The method of claim 13 wherein a vacuum is applied within the chamber.

15. The method of claim 14 wherein the wafer is heated in the chamber.

* * * * *